United States Patent [19]

Hirae et al.

[11] Patent Number: 5,475,319
[45] Date of Patent: Dec. 12, 1995

[54] METHOD OF MEASURING ELECTRIC CHARGE OF SEMICONDUCTOR WAFER

[75] Inventors: Sadao Hirae; Motohiro Kouno; Hideaki Matsubara, all of Kyoto, Japan

[73] Assignee: Dainippon Screen Mfg. Co., Ltd., Japan

[21] Appl. No.: 252,848

[22] Filed: Jun. 2, 1994

[30] Foreign Application Priority Data

Jun. 8, 1993 [JP] Japan ................... 5-164144

[51] Int. Cl.⁶ ................... G01R 31/26
[52] U.S. Cl. ................... 324/765; 324/71.5; 324/766; 250/307
[58] Field of Search ................... 324/662, 663, 324/671, 678, 686, 755, 766, 752, 71.1, 71.5, 96, 158.1; 250/306, 307, 561, 211, 423 F, 49.2; 437/8; 356/373, 400

[56] References Cited

U.S. PATENT DOCUMENTS

| | | |
|---|---|---|
| 3,873,209 | 3/1975 | Schinke et al. . |
| 3,995,216 | 11/1976 | Yun ................... 324/765 |
| 4,322,979 | 4/1982 | Fromm . |
| 4,464,627 | 8/1984 | Munakata et al. ................... 324/765 |
| 4,490,618 | 12/1984 | Cielo . |
| 4,681,451 | 7/1987 | Guerra et al. . |
| 4,827,212 | 5/1989 | Kamieniecki ................... 324/765 |
| 4,865,453 | 9/1989 | Gidon et al. . |
| 5,028,132 | 7/1991 | Hickel et al. . |
| 5,091,691 | 2/1992 | Kamieniecki et al. ................... 324/765 |
| 5,125,740 | 6/1992 | Sato et al. . |
| 5,225,690 | 7/1993 | Sakai et al. . |
| 5,233,291 | 8/1993 | Kouno et al. ................... 324/765 |
| 5,239,183 | 8/1993 | Kouno et al. . |

FOREIGN PATENT DOCUMENTS

| | | |
|---|---|---|
| 604233 | 6/1994 | European Pat. Off. ................... 324/765 |
| 582602 | 6/1981 | Japan . |
| 63-111403 | 10/1986 | Japan . |
| 63-255606 | 4/1987 | Japan . |
| 63-263401 | 4/1987 | Japan . |
| 90/04753 | 5/1990 | WIPO . |

*Primary Examiner*—Kenneth A. Wieder
*Assistant Examiner*—Diep Do
*Attorney, Agent, or Firm*—Ostrolenk, Faber, Gerb & Soffen

[57] ABSTRACT

Amounts of electric charges in a semiconductor wafer are measured by using a non-destructive measuring device. First and second flat-band voltages before and after a specific charging process are measured with a non-destructive C-V measurement device. A gap between a test electrode and a surface of a semiconductor wafer is also measured before and after performing the charging process. The electric charge accumulated proximate the surface of the semiconductor wafer is determined according to measured values of the gap and the flat-band voltages before and after performing the charging process.

10 Claims, 8 Drawing Sheets

METHOD OF MEASURING ELECTRIC CHARGE OF SEMICONDUCTOR WAFER

BACKGROUND OF THE INVENTION

1. Field of the Invention

The present invention relates to a method of measuring electric charge of a semi-conductor wafer, and more specifically to measurement of electric charges accumulated in an insulating film of a semiconductor wafer.

2. Description of the Related Art

Semiconductor wafers are exposed to charged particles in ion implantation processes, plasma CVD (Chemical Vapor Deposition) processes, and other plasma- related processes for etching and resist removal. These processes accumulate electric charges proximate the surface of a semiconductor wafer, or more specifically inside an insulating film of the semiconductor wafer. In a rinsing process, friction between the semiconductor wafer and gaseous or liquid rinse substance electrically charges surface layers of the semiconductor wafer.

Accumulation of excessive electric charges in the surface layers of a semiconductor wafer makes a high electric field, which destroys the structure of semiconductor devices to deteriorate properties thereof, thus lowering the yield of manufacture of semiconductors. The amount of the electric charge accumulated in the surface layers of a semiconductor wafer, however, depends highly on the individual processing apparatus even for the same process; well-adjusted processing apparatus will produce a smaller charge whereas poorly-adjusted apparatus will produce a greater charge. Measurement of the electric charges in the surface layers of a semiconductor wafer is thereby useful for evaluating the conditions of each processing apparatus.

Conventionally, the electric charge is measured by: bringing a specific probe into contact with or proximate to a target semiconductor wafer; measuring a potential on the surface of the target semiconductor wafer; and determining the accumulated charges based on the surface potential.

The surface potential, however, only indicates a rough magnitude of the electric charges, and the amount of the electric charges cannot be obtained from measurement. In other words, there is no conventional method and apparatus for measuring the amount of electric charge in a surface layer of a semiconductor wafer.

SUMMARY OF THE INVENTION

An object of the present invention is to measure electric charges accumulated proximate a surface of a semiconductor wafer.

The present invention is directed to a method of measuring electric charge in an insulating film formed on a surface of a substrate of a semiconductor wafer. The method comprises the steps of: (a) measuring a C-V characteristic of the semiconductor wafer to determine a first flat-band voltage; (b) treating the semiconductor wafer by a specific process; (c) measuring a C-V characteristic of the semiconductor wafer after the specific process to determine a second flat-band voltage; and (d) determining the electric charge in the insulating film of the semiconductor wafer accumulated through the specific process as a function of the first and second flat-band voltages.

Since a flat-band voltage represents an integral of charge distribution in the surface part of a semiconductor wafer, the electric charge accumulated in the insulating film through a specific process can be determined as a function of the first and second flat band voltages before and after the specific process.

The present invention is also directed to a method of measuring an electric charge in an insulating film formed on a surface of a substrate of a semiconductor wafer, comprising the steps of: (a) providing a non-destructive measuring device comprising a test electrode and holding means for holding the test electrode apart from the semiconductor wafer; (b) measuring a C-V characteristic of the semiconductor wafer with the non-destructive measuring device to determine a first flat-band voltage $V_{fb}$; (c) treating the semiconductor wafer by a specific process; (d) measuring a C-V characteristic of the semiconductor wafer after the specific process with the non-destructive measuring device to determine a second flat-band voltage $V'_{fb}$; and (e) determining the electric charge in the insulating film of the semiconductor wafer accumulated through the specific process as a function of the first and second flat-band voltages.

According to a preferred embodiment of the present invention, the step (b) comprises holding the test electrode spaced from the semiconductor wafer by a gap $d_{air}$; the step (d) comprises holding the test electrode spaced from the semiconductor wafer by the gap $d_{air}$; and the step (e) comprises determining the electric charge qNi according to the following equation:

$$\Delta Vfb = -\frac{Rp + \epsilon_{in} d_{air}}{\epsilon_0 \epsilon_{in}} qNi$$

where $\Delta V_{fb}$ is equal to $(V'_{fb}-V_{fb})$, Rp denotes a projected range of charged particles injected into the insulating film through the specific process, $\epsilon_0$ denotes a permittivity in vacuum, and $\epsilon_{in}$ denotes a dielectric constant of the insulating film.

Each of the steps (b) and (d) further comprises the steps of: introducing a light beam into a transparent reflector of the holding means to be reflected by a reflecting plane of the reflector under geometric optical total reflection conditions while the reflecting plane is spaced substantially parallel to the semiconductor wafer; measuring reflectance of the light beam reflected by the reflecting plane; and determining the gap $d_{air}$ as a function of the reflectance.

According to another aspect of the present invention, the step (b) comprises holding the test electrode spaced from the semiconductor wafer by a first gap $d_{air}$; the step (d) comprises holding the test electrode spaced from the semiconductor wafer by a second gap $d'_{air}$; and the step (e) comprises determining the electric charge qNi according to the following equations:

$$qNi = \frac{din + \epsilon_{in} d_{air}}{Rp + \epsilon_{in} d_{air}} (qN'fb - qNfb)$$

$$qNfb = \frac{\epsilon_0 \epsilon_{in}}{(din + \epsilon_{in} d_{air})} (\phi_{ms} - Vfb)$$

$$qN'fb = \frac{\epsilon_0 \epsilon_{in}}{(din + \epsilon_{in} d'_{air})} (\phi_{ms} - V'fb)$$

where Rp denotes a projected range of charged particles injected into the insulating film through the specific process, $\epsilon_0$ denotes a permittivity in vacuum, $\epsilon_{in}$ denotes a dielectric constant of the insulating film, $d_{in}$ denotes a thickness of the insulating film, and $\phi_{ms}$ denotes a work function difference between the test electrode and the substrate.

The step (b) further comprises: introducing a first light beam into a transparent reflector of the holding means to be reflected by a reflecting plane of the reflector under geometric optical total reflection conditions while the reflecting plane is spaced substantially parallel to the semiconductor wafer; measuring a first reflectance of the first light beam reflected by the reflecting plane; and determining the first gap $d_{air}$ as a function of the first reflectance. The step (d) further comprises: introducing a second light beam into the transparent reflector to be reflected by the reflecting plane under geometric optical total reflection conditions while the reflecting plane is spaced substantially parallel to the semiconductor wafer; measuring a second reflectance of the second light beam reflected by the reflecting plane; and determining the second gap $d'_{air}$ as a function of the second reflectance.

According to still another aspect of the present invention, the method comprises the steps of: (a) providing a measuring device comprising a test electrode having a second insulating layer under the test electrode; (b) placing the test electrode onto the semiconductor wafer so that the second insulating layer is in contact with the first insulating layer, and measuring a C-V characteristic of the semiconductor wafer with the measuring device to determine a first flat-band voltage $V_{fb}$; (c) treating the semiconductor wafer by a specific process; (d) placing the test electrode onto the semiconductor wafer so that the second insulating layer is in contact with the first insulating layer, and measuring a C-V characteristic of the semiconductor wafer after the specific process with the measuring device to determine a second flat-band voltage $V'_{fb}$; and (e) determining the electric charge in the first insulating layer of the semiconductor wafer accumulated through the specific process as a function of the first and second flat-band voltages.

The step (e) comprises determining the net electric charge qNi according to the following equation:

$$\Delta V_{fb} = \frac{Rp + \frac{\epsilon_{in1} d_{in2}}{\epsilon_{in2}}}{\epsilon_0 \epsilon_{in1}} qNi$$

where $\Delta V_{fb}$ is equal to $(V'_{fb} - V_{fb})$, Rp denotes a projected range of charged particles injected into the first insulating layer through the specific process, $\epsilon_0$ denotes a permittivity in vacuum, $\epsilon_{in1}$ denotes a dielectric constant of the first insulating layer, $\epsilon_{in2}$ denotes a dielectric constant of the second insulating layer, and $d_{in2}$ denotes a thickness of the second insulating layer.

These and other objects, features, aspects, and advantages of the present invention will become more apparent from the following detailed description of the preferred embodiment including the accompanying drawings.

DESCRIPTION OF THE PREFERRED EMBODIMENT

A. Structure of Apparatus

Figure 1:
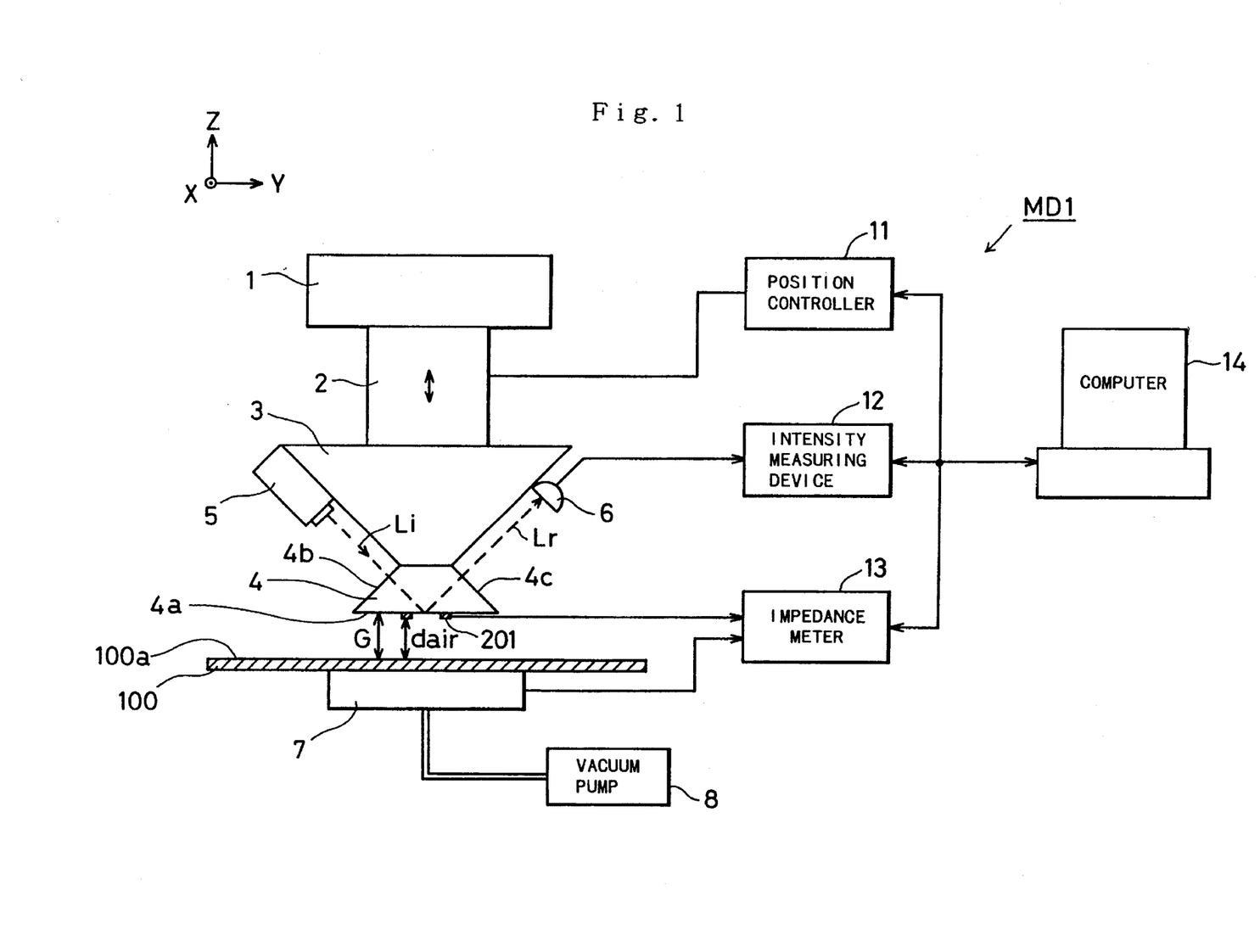
FIG. 1 schematically illustrates the structure of a non-destructive C-V characteristic measurement device.

FIG. 1 schematically illustrates the structure of a non-destructive C-V (Capacitance-Voltage) characteristic measurement device. The device comprises a support table 1, a piezoelectric actuator 2 connected under the support table 1, and a stand 3 placed below the piezoelectric actuator 2. A prism 4 is mounted on a bottom surface of the stand 3. A laser 5 such as an AlAs laser is mounted to one of two inclined surfaces of the stand 3, and a photosensor 6 such as a photo diode is mounted to the other inclined surface of the stand 3.

A bottom face 4a of the prism 4 is spaced in parallel with an upper surface of a metallic sample table 7, on which a semiconductor wafer 100 is mounted. A vacuum pump 8 is connected to the bottom of the sample table 7 to suction the semiconductor wafer 100 down onto the table 7, thereby reducing the electric resistance between the wafer 100 and the metallic table 7.

A ring-shaped test electrode 201 is formed on the bottom surface 4a of the prism 4. The semiconductor wafer 100 mounted on the sample table 7 is spaced from the prism 4 by a gap G, and an upper surface 100a of the semiconductor wafer 100 is arranged substantially in parallel with the bottom surface 4a of the prism 4. The sample table 7 is driven by a motor (not shown) to rotate within a horizontal plane, and is placed on an x-y table (not shown) to move along x- and y-axes.

In the non-destructive measurement device, the gap G between the prism 4 and the wafer 100, and and another gap $d_{air}$ between the test electrode 201 and the wafer 100 are determined by taking advantage of the tunnel effect of a laser beam which is reflected by the bottom face 4a of the prism 4 in geometric optical total reflection conditions. The detailed structure and the operation of the non-destructive measurement device are disclosed in U.S. Pat. No. 5,233,291, the disclosure of which is incorporated herein by reference.

A position controller 11 is electrically connected with the piezoelectric actuator 2, and the stand 3 is moved by the actuator 2 in a z-direction responsive to a voltage applied from the position controller 11. An intensity measuring device 12 is electrically connected with the photosensor 6, and an impedance meter 13 is electrically connected to the test electrode 201 and the metallic sample table 7. The impedance meter 13 measures a total capacity between the test electrode 201 and the sample table 7. The position controller 11, the intensity measuring device 12, and the impedance meter 13 are connected to a computer 14, such as a personal computer. The computer 14 controls the non-destructive measurement device and executes data processing for a variety of given data.

B. Charge Distribution and Flat-Band Voltage

Figure 2A:
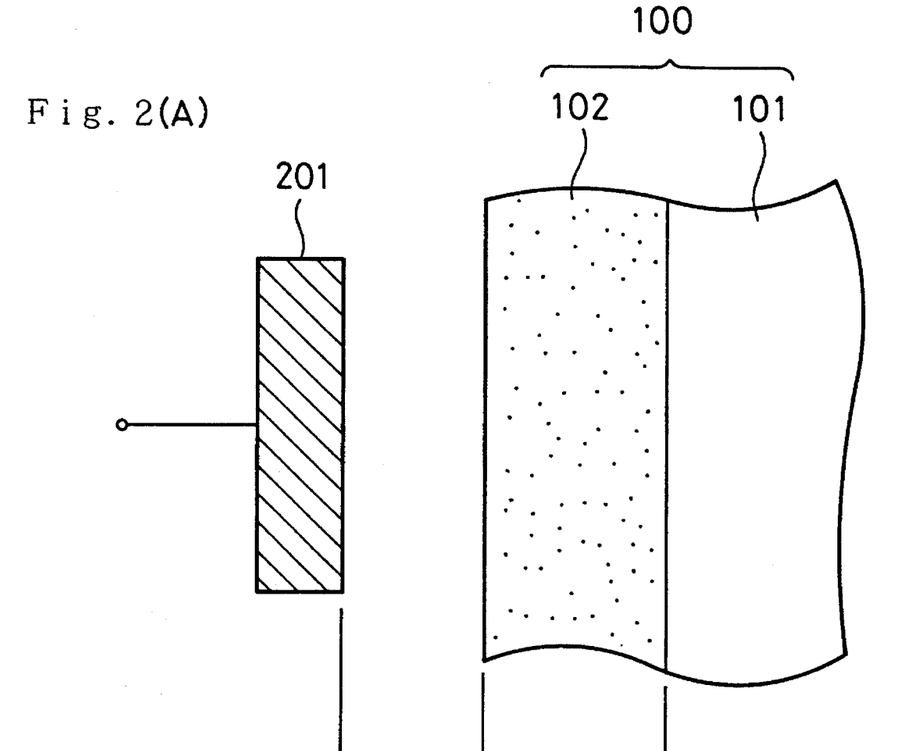
FIGS. 2(A) and 2(B) show charge distributions proximate an oxide film formed on the surface of a semiconductor.
Figure 2B:
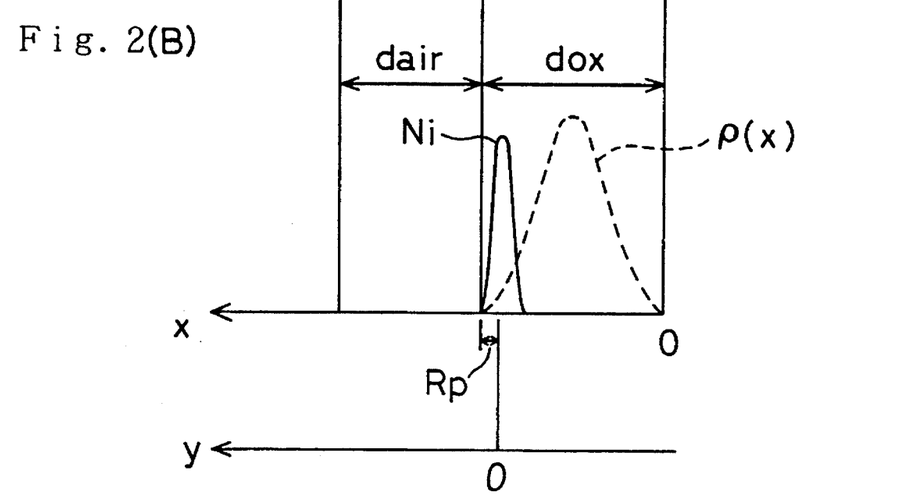

FIGS. 2(A) and 2(B) show electric charge distributions proximate an oxide film 102 of a semiconductor. As shown in FIG. 2(A), the test electrode 201 is spaced by the gap $d_{air}$ from the surface of the semiconductor wafer 100. The wafer 100 comprises a substrate 101 and an oxide film 102 of a thickness $d_{ox}$. FIG. 2(B) is a graph showing distributions of charges Ni(x) and p(x) plotted against a distance x from an interface between the substrate 101 and the oxide film 102, where p(ρ) shows a charge distribution before a specific charging-up process such ion implantation, and Ni(x) shows a charge distribution after the specific charging-up process.

Figure 3:
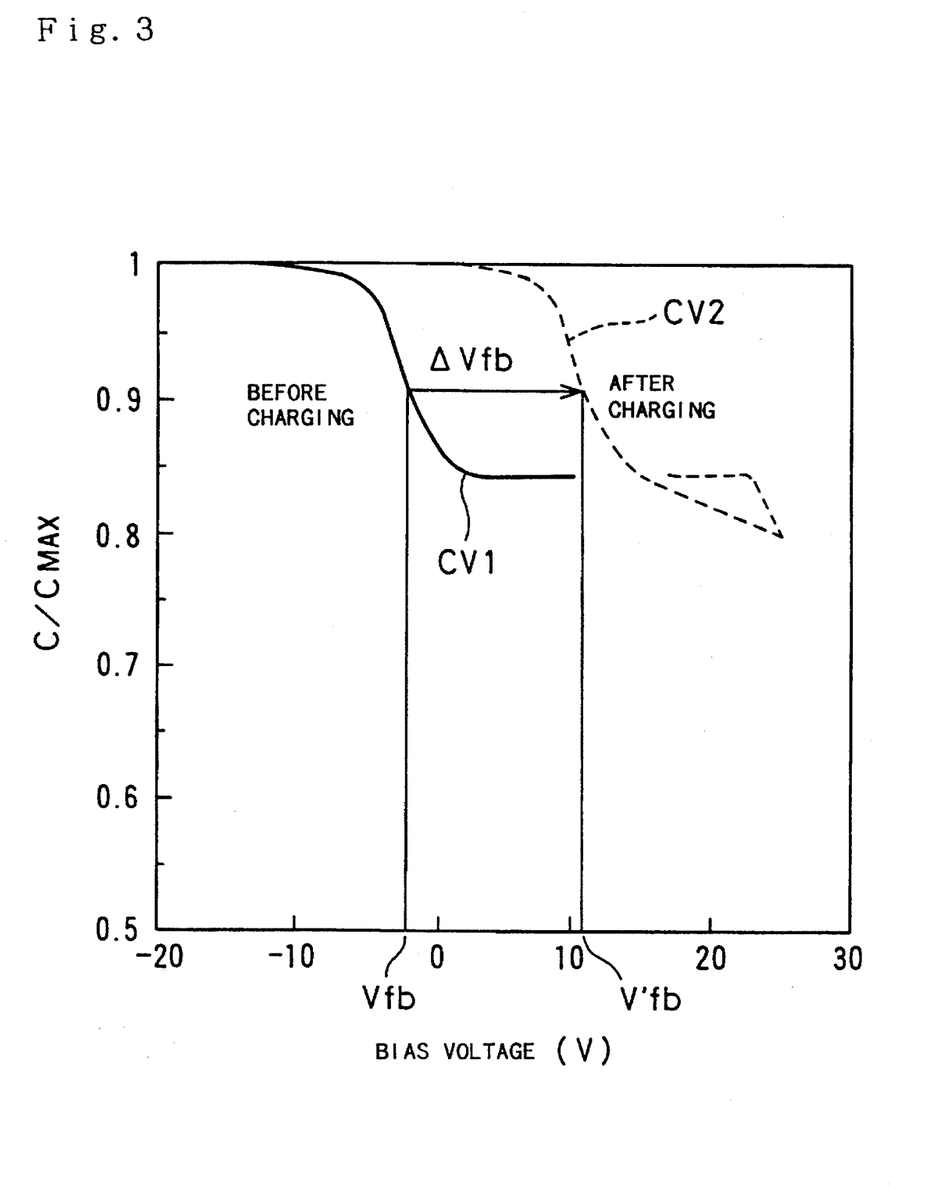
FIG. 3 is a graph showing a shift of C-V curve due to a charging-up process.

Since the air gap dair is electrically equivalent to an oxide film having a thickness of $\epsilon_{ox}d_{air}$, where $\epsilon_{ox}$ is permittivity of the oxide. Therefore, the structure shown in FIG. 2(A) is equivalent to a MOS capacitor having an oxide film of a thickness of $(\epsilon_{ox}d_{air}+d_{ox})$. A first curve CV1 shown in FIG. 3 shows a C-V curve for the structure shown in FIG. 2(A) before a specific charging-up process. A flat-band voltage Vfb for the first C-V curve CV1 is:

$$Vfb = \phi ms - \frac{1}{\epsilon 0 \epsilon ox} \int_0^{dox+dair} (dox + \epsilon oxdair - x)\rho(x)dx \quad (1)$$

where $\phi_{ms}$ denotes a work function difference between the test electrode 201 and the semiconductor substrate 101, $\epsilon 0$ a permittivity in vacuum, $\epsilon_{ox}$ a dielectric constant of the oxide film, $d_{ox}$ a thickness of the oxide film, $d_{air}$ an air gap, and p(x) denotes charges per unit area in the oxide film.

When charged particles are injected into the semiconductor wafer in a specific charging process, electric charges Ni as shown in FIG. 2(B) are accumulated in the vicinity of a certain position apart by a predetermined distance Rp from the surface of the oxide film 102, or by a distance $(d_{ox}-Rp)$ from the interface between the semiconductor substrate 101 and the oxide film 102. The parameter Rp is called projected range, representing a depth of implantation of the electric charges injected in the oxide film 102. More exactly, the projected range Rp is defined to be a distance between a surface of the oxide film 102 and the charge center. The projected range Rp is theoretically determined according to a type of the charged particle and an acceleration voltage. When arsenic ions ($As^+$) are injected into a silicon oxide film with a voltage of 50 KeV, for example, the projected range Rp is equal to about 26 nanometers. According to a known LSS theory, the charge distribution Ni forms a Gaussian distribution having a standard deviation of ΔRp around the projected range Rp as the charge center, where ΔRp is called projected straggle.

The second curve CV2 in FIG. 3 shows a C-V curve after negative charging of the oxide film 102. A flat-band voltage $V'_{fb}$ for the second C-V curve is CV2 is determined according to the following equation:

$$V'fb = \phi ms - \frac{1}{\epsilon 0 \epsilon ox} \int_0^{dox+dair} (dox + \epsilon oxdair - x) * \\ \rho(x) + qNi(x + Rp - dox)\}dx \quad (2)$$

where q denotes an elementary charge, and Ni denotes distribution of electric charges accumulated through the charging process. A function form Ni(y) used in the equation (2) has the following Gaussian distribution:

$$Ni(y) = \frac{Ni}{(2\pi)^{1/2}\Delta Rp} \exp\left\{ -\frac{(y-Rp)^2}{2\Delta Rp^2} \right\} \quad (3)$$

where Ni in the right hand side denotes a charge per unit area, and y=(x+Rp−dox) in the equation (2).

If the projected straggle ΔRp is less than several nanometers and negligibly small compared with the gap $d_{air}$ and the oxide thickness $d_{ox}$, it can be assumed that the electric charges are localized at a certain position of x=(dox−Rp), which is apart from the surface of the oxide film 102 by the projected range Rp. The charge Ni in the right hand side of the equation (3) represents the localized electric charges at the position of x=(dox−Rp).

C. Charge Measurement with Constant Gap

If the gap $d_{air}$ is kept constant for C-V measurement before and after the charging process, a shift of the flat-band voltage, or $\Delta V_{fb}=(V'_{fb}-V_{fb})$, can be given from the equations (1) and (2) by:

$$\Delta Vfb = \frac{Rp + \epsilon oxdair}{\epsilon 0 \epsilon ox} qNi \quad (4)$$

The net charge qNi is determined by substituting known values of Rp, $\epsilon 0$ and $\epsilon_{ox}$, and measured values of $\Delta V_{fb}$ and $d_{air}$ into the equation (4).

According to the equation (4), the flat-band voltage shift $\Delta V_{fb}$ is a linear function of the gap $d_{air}$. If the net charge qNi remains the same, the flat-band voltage shift $\Delta V_{fb}$ increases as the gap $d_{air}$ increases. Therefore, the measurement accuracy of the flat-band voltage shift $\Delta V_{fb}$ can be improved by increasing the gap $d_{air}$.

A measurable range of the flat-band voltage shift $\Delta V_{fb}$ is not greater than a maximum voltage of an external power source or a maximum voltage range of a voltmeter used in the C-V curve measurement. Therefore, the flat-band voltage may not be able to be measured in the case where the net charge qNi becomes too great. In that case, it would be a good way to place the test electrode 201 sufficiently close to a semiconductor wafer in the C-V curve measurement. Suppose that the oxide film 102 is negatively charged under the conditions of Ni=$10^{13}cm^{-2}$ and Rp=0, and that a maximum voltage of an external power source is 100 V, the flat-band voltage shift $\Delta V_{fb}$ is about 452 V for the gap $d_{air}$ of 250 nanometers. However, the flat-band voltage shift $\Delta V_{fb}$ would become about 90.4 V if the gap $d_{air}$ is reduced to 50 nanometers. In other words, the flat-band voltage shift $\Delta V_{fb}$ can be measured with a voltmeter having a maximum range of 100 V by reducing the gap $d_{air}$ to 50 nanometers. According to the present invention, the measurable range of the flat-band voltage can be extended by adjusting the gap $d_{air}$ in the above manner. In order to determine the amount of the net charge qNi from the equation (4), however, the gap $d_{air}$ should be kept constant before and after the charging process.

D. Charge Measurement with Varied Gap

When the gap $d_{air}$ is changed before and after the charging process, the charge density qNi can be determined in the following manner.

Assuming that all the electric charges in the oxide film were distributed in the interface between the substrate 101 and the oxide film 102, the equation (1) would be rewritten as:

$$Vfb = \phi ms - \frac{qN_{fb}}{\epsilon 0 \epsilon ox}(dox + \epsilon oxdair) \quad (5)$$

where $qN_{fb}$ denotes an apparent net charge density at the interface.

In a similar manner, the equation (2) for determining the flat-band voltage $V'_{fb}$ after the charging process is rewritten as:

$$V'fb = \phi ms - \frac{qN'fb}{\epsilon 0 \epsilon ox} (dox + \epsilon ox \, d'air) \quad (6)$$

Where $qN'_{fb}$ denotes an apparent net charge density hypothetically existing at the interface between the substrate 101 and the oxide film 102.

The apparent net charge density $qN'_{fb}$ is equal to a sum of the apparent net charge density $qN_{fb}$ given by the equation (5) and the net charge density $qNi$. The equation (6) is further rewritten as:

$$V'fb = \phi ms - \frac{q}{\epsilon 0 \epsilon ox} \{(Rp + \epsilon ox \, d'air)Ni + (dox + \epsilon ox \, d'air)Nfb\} \quad (7)$$

where $(Rp + \epsilon o \, d'_{air})$ represents a distance between the charge-up center and the test electrode 201 (FIG. 2B) converted in terms of oxide thickness. The projected straggle $\Delta Rp$ is assumed to be zero in the equation (7).

By eliminating the term $V'_{fb}$ from the equations (6) and (7), the net charge density $qNi$ is expressed as:

$$qNi = a \frac{dox + \epsilon oxdair}{Rp + \epsilon oxdair} (N'fb - Nfb) \quad (8)$$

Using the measured values of $V_{fb}$, $V'_{fb}$, $d_{air}$ and $d'_{air}$ before and after the charging process, the apparent net charge densities $qN_{fb}$ and $qN'_{fb}$ are obtained according to the equations (5) and (6). Then the net charge density $qNi$ can be determined by substituting the values of $N_{fb}$ and $N'_{fb}$ into the equation (8). Since the gaps $d_{air}$ and $d'_{air}$ in the equations (5) and (6) can be different, the amount of the net charge density $qNi$ is determined according to the equation (8) even if the gap is not kept constant before and after the charging process.

E. Measurement Examples

Figure 4:
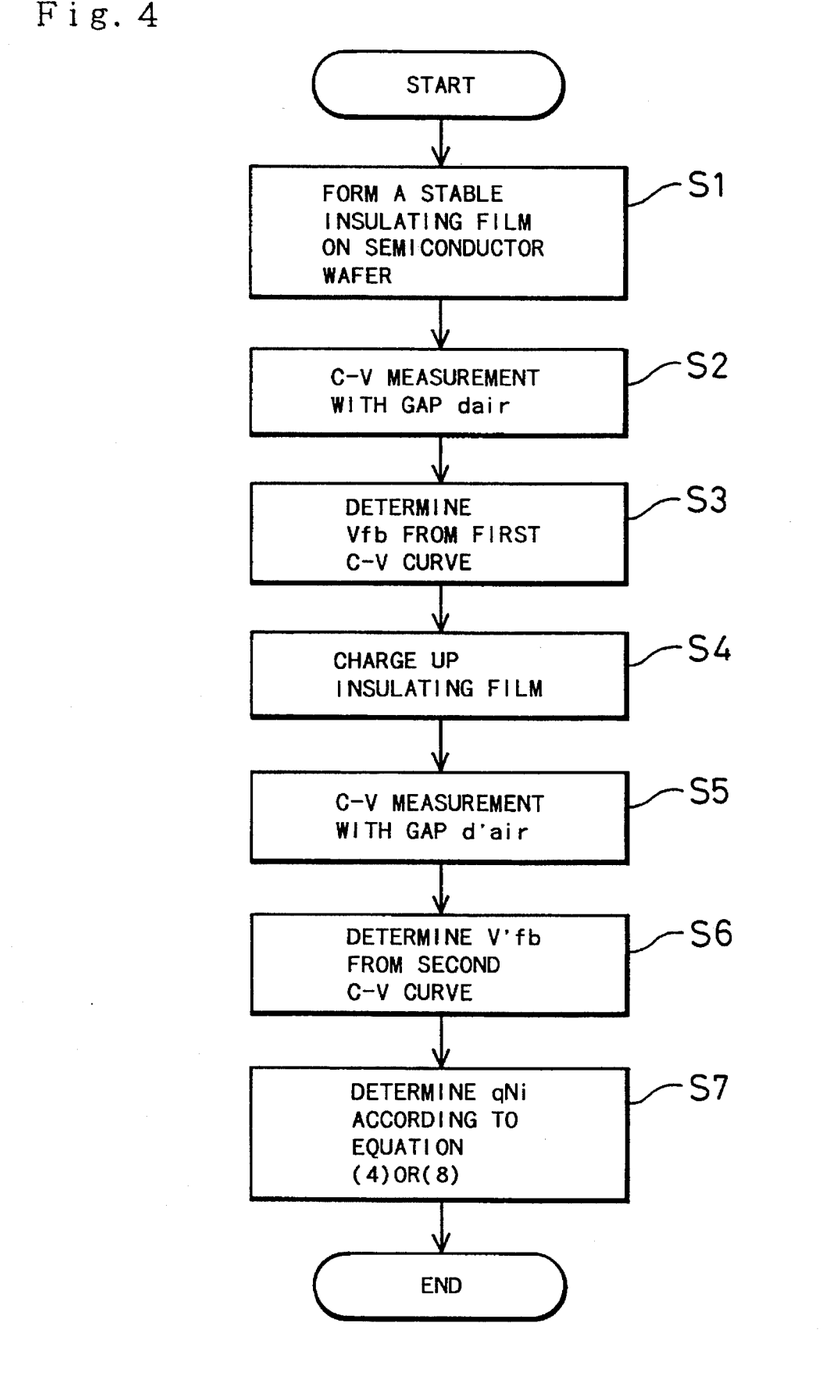
FIG. 4 is a flowchart showing a method of measuring electric charges embodying the present invention.

FIG. 4 is a flowchart showing the measurement procedure embodying the present invention. At step S1, an electrically and chemically stable insulating film is formed on a semiconductor wafer through thermal oxidation or chemical vapor deposition (CVD). At step S2, the semiconductor wafer is mounted in the non-destructive C-V measurement device shown in FIG. 1, and C-V measurement is executed to determine the flat-band voltage $\Delta V_{fb}$. In the C-V curve measurement, the gap $d_{air}$ between the test electrode 201 and the oxide film 102 is set at a predetermined value. An accurate value of the gap $d_{air}$ is determined by measuring a reflectance of a laser beam reflected by the bottom surface $4_a$ of the prism 4 under the conditions of geometric optical total reflection. The method of determining the accurate value of the gap $d_{air}$ is described in U.S. Pat. No. 5,233,291, the disclosure of which is incorporated by reference hereby.

At step S3, the computer 14 analyzes the measured C-V curve to determine the flat-band voltage $V_{fb}$ before a charging process. The flat-band voltage $V_{fb}$ thus determined is stored in a memory of the computer At step S4, the semiconductor wafer is removed from the non-destructive measurement device, and treated by a predetermined process to be evaluated, for example, ion implantation or plasma-related process, to charge up the oxide film 102.

At step S5, the C-V measurement is executed again for the semiconductor wafer after the charging process. At step S6, the computer 14 analyzes the measured C-V curve to determine the flat-band voltage $V'_{fb}$ after the charging-up process.

At step S7, the net charge density $gNi$ is determined according to the equation (4) or (8) from the flat-band voltages $V_{fb}$ and $V'_{fb}$ and the measured gaps $d_{air}$ and $d'_{air}$ before and after the charging process.

F. First and Second Examples

Figure 5A:
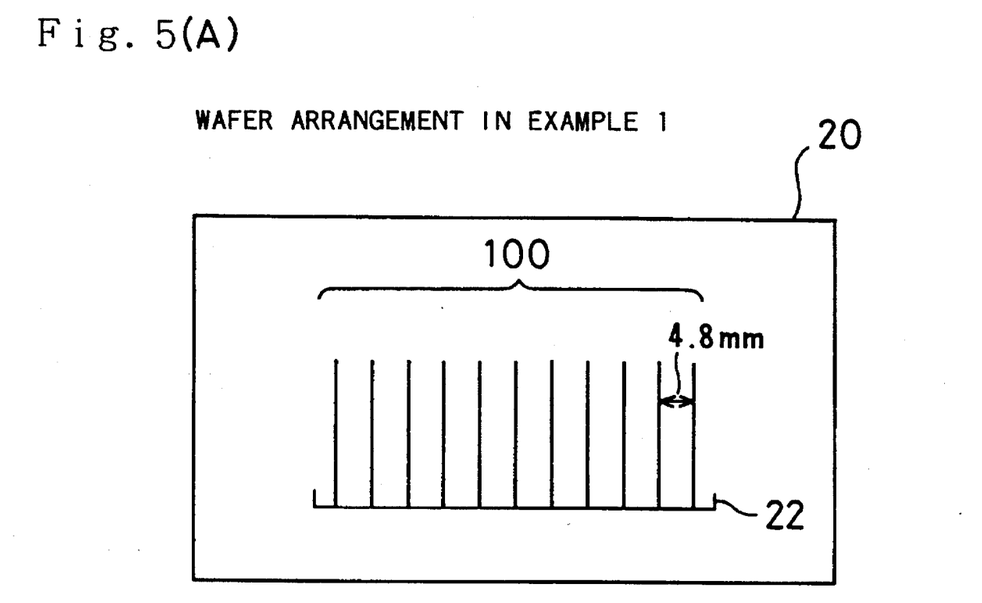
FIGS. 5(A) and 5(B) schematically show setup of semiconductor wafers in a plasma chamber.
Figure 5B:
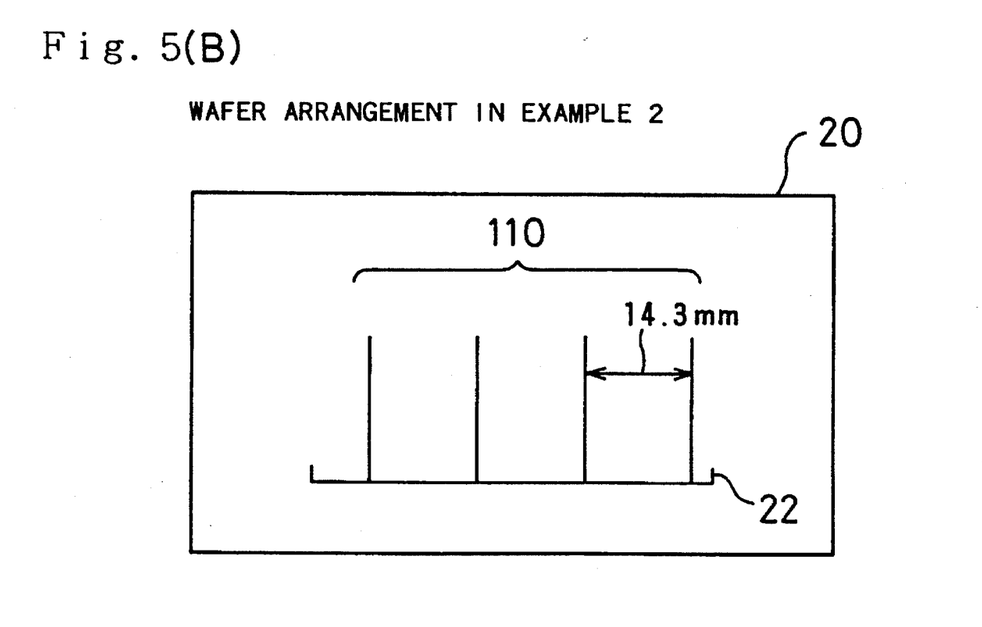

In Examples 1 and 2, electric charges were measured for semiconductor wafers which were exposed to plasma in a plasma chamber. Plasma chambers are generally used for removing a resist. FIGS. 5(A) and 5(B) schematically illustrate setup of semiconductor wafers in a plasma chamber 20. In Example 1 shown in FIG. 5(A), a plurality of semiconductor wafers 100 were placed vertically on a boat 22 at intervals of 4.8 mm. In Example 2 shown in FIG. 5(B), a plurality of semiconductor wafers 110 were arranged at intervals of 14.3 mm on the boat 22. Each semiconductor wafer was covered with an oxide film of approximately 110 nanometers in thickness.

Prior to plasma exposure, one sample was selected from each group of the semiconductor wafers 100 and 110, and a C-V curve was measured at plural positions on each sample to determine the apparent surface charge $N_{fb}$ at the oxide/substrate interface. The gap $d_{air}$ was set at 334 nanometers in the C-V curve measurement. The average apparent surface charge $N_{fb}$ was $2.9 \times 10^{10} \text{cm}^{-2}$ and its variance $\sigma$ was $1.9 \times 10^9 \text{cm}^{-2}$ for the sample semiconductor wafer 100 in Example 1. The average apparent surface charge $N_{fb}$ was $3.8 \times 10^{10} \text{cm}^{-2}$ and its variance $\sigma$ was $1 \times 10^{10} \text{cm}^{-2}$ for the sample semiconductor wafer 110 in Example 2.

After the initial C-V curve measurement, the semiconductor wafers 100 and 110 were arranged in the plasma chamber 20 as shown in FIGS. 5(A) and 5(B), respectively. The semiconductor wafers 100 and 110 were then respectively exposed to oxygen plasma generated by a high-frequency power of 13.56 MHz/600 W, and a micro-wave power of 2.45 GHz/300 W for ten minutes. Each sample of the semiconductor wafers 100 and 110 was then taken out of the plasma chamber 20, and C-V curve measurement was executed again with the samples. The gap $d'_{air}$ was set at 348 nanometers in Example 1 and 342 nanometers in Example 2. In both of Examples 1 and 2, the gap $d_{air}$ before charging and the gap $d'_{air}$ after charge were different from each other. Therefore, the equation (8) was used to determine the net charge density $qNi$. The projected range $Rp$ was assumed to be 5 nanometers from the high-frequency plasma conditions in the plasma chamber 20.

Figure 6:
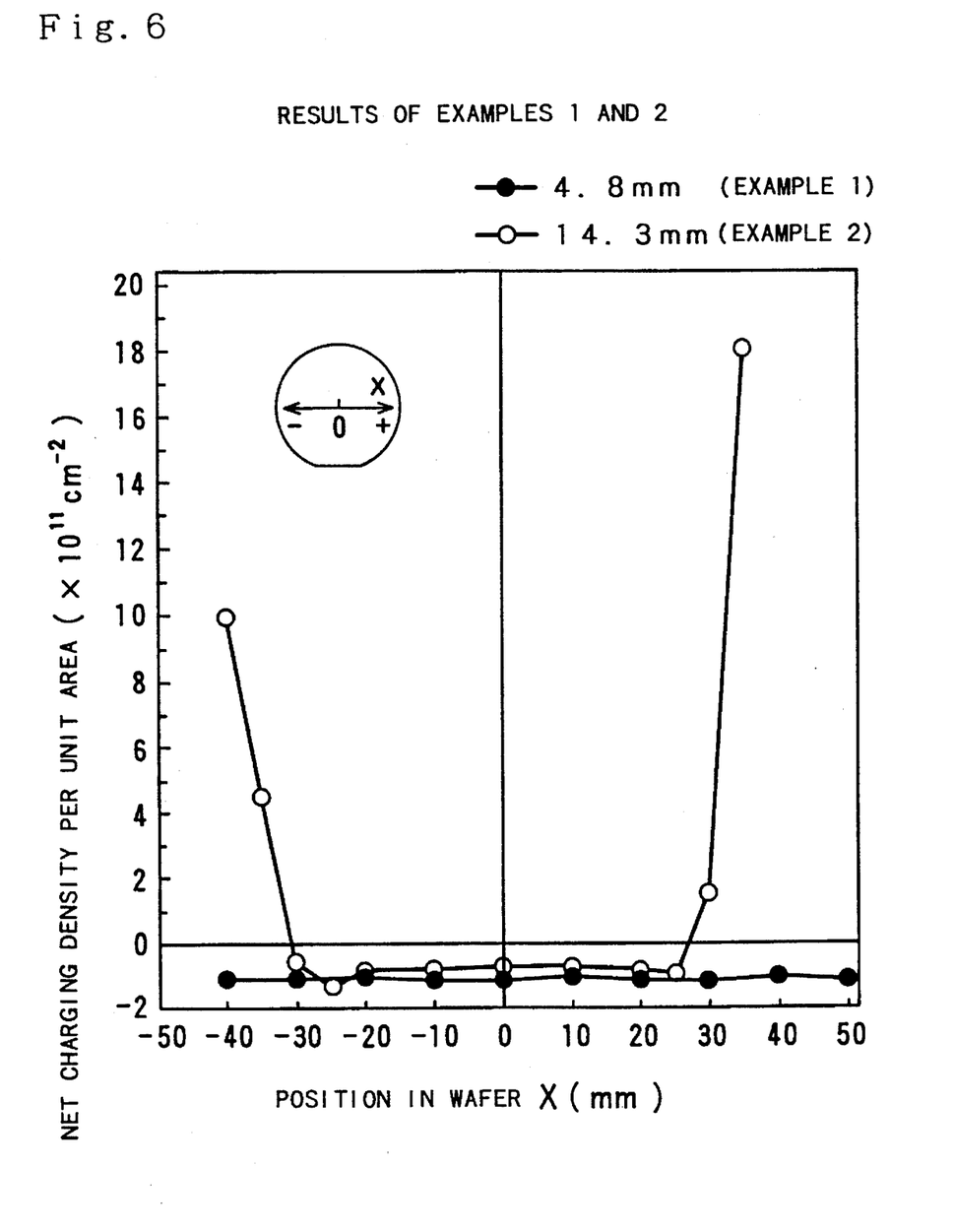
FIG. 6 is a graph showing charge distributions on semiconductor wafers measured in Examples 1 and 2.

FIG. 6 is a graph showing distributions of the measured net charge densities on the sample semiconductor wafers in Examples 1 and 2. The results of Example 1 shows substantially uniform negative charge densities. The results of Example 2 show negative charge densities around a center of the sample semiconductor wafer and positive charge densities on both ends of the sample semiconductor wafer. Since the non-destructive C-V measurement device was used in the C-V measurement, the distribution of the charge density can be obtained easily by moving a measurement point on the sample wafer without damaging the wafer and the test probe.

G. Example 3

Figure 7:
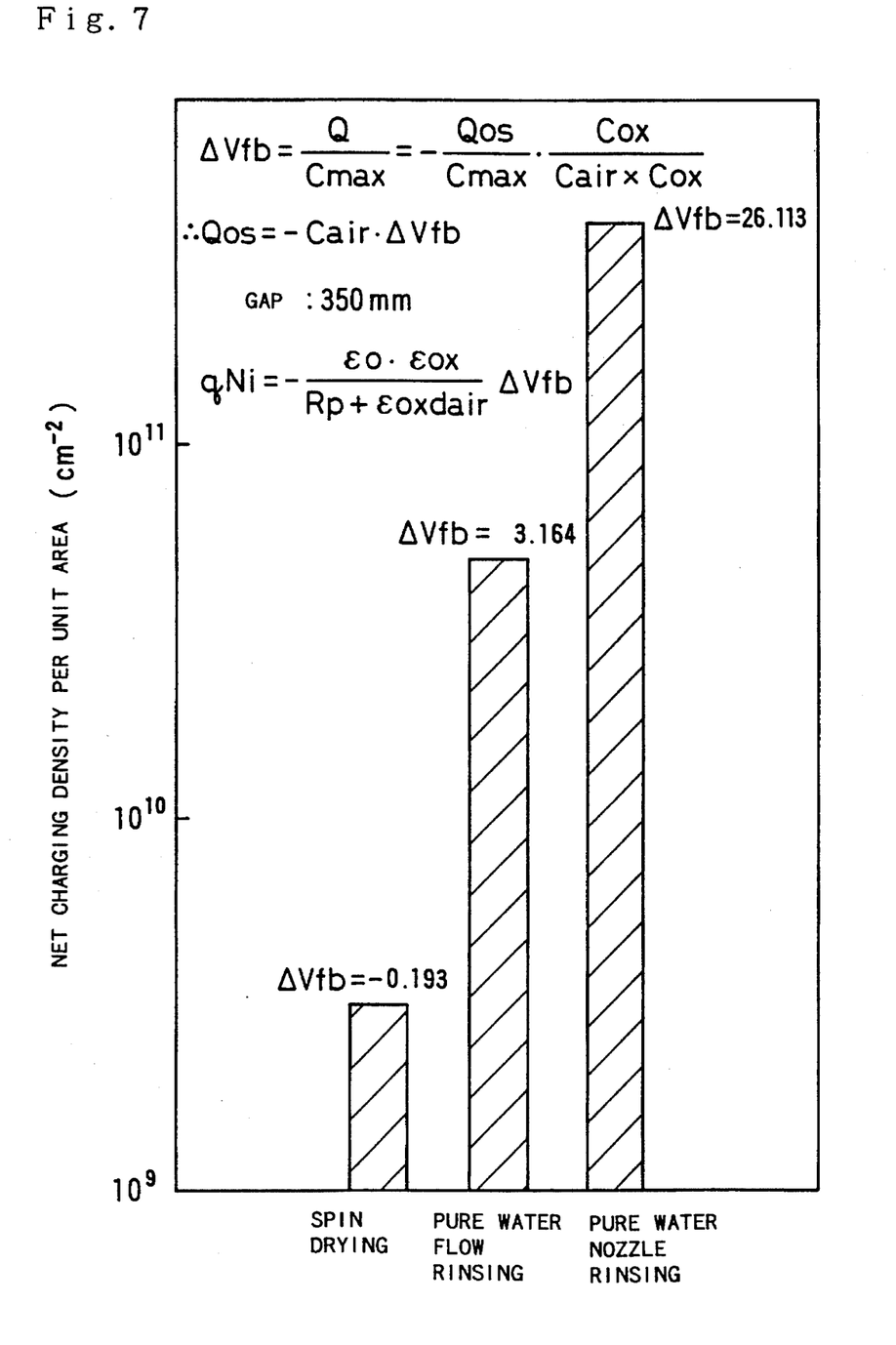
FIG. 7 is a graph showing electric charges measured in Example 3.

In Example 3, electric charges proximate the surface of a silicon wafer was measured after rinsing process and drying process of the silicon wafer. FIG. 7 is a graph showing the measured charge densities in Example 3. Since the surface of a silicon oxide film is hydrophilic, spraying of ultra pure water having a specific resistance of more than 18MΩ makes the surface negatively charged. Friction with a gaseous substance also charges the surface of the silicon oxide film. In Example 3, the charge density was accordingly measured for three different processes, spin drying, pure water flow rinsing, and pure water nozzle rinsing as shown in FIG. 7. In the spin drying process, the silicon wafer was dried through rotation at a high speed of 750 rpm for five minutes in a highly purified air. The flow of pure water was adjusted to one liter per minute in the pure water flow rinsing process, and at five liter per minute in the pure water nozzle rinsing process. It was assumed that only the surface of the silicon oxide film was charged up in all of the the three processes, and the projected range Rp was thereby assumed to be zero. As shown in FIG. 7, even the electric charge on the surface of the oxide film can be measured according to the present invention.

Figure 8A:
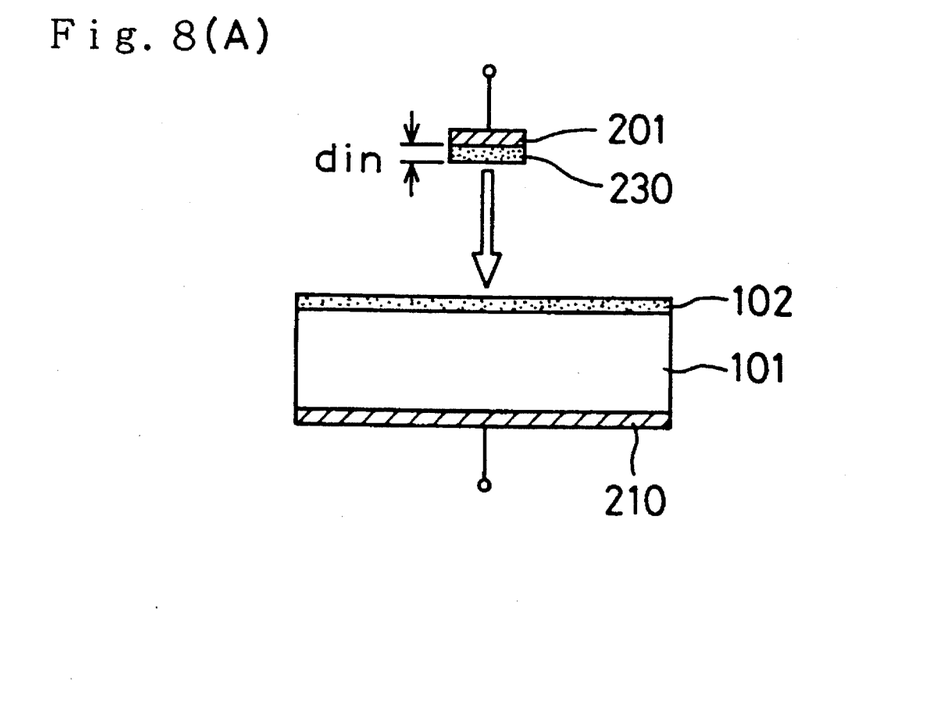
FIGS. 8(A) and 8(B) illustrate another method for C-V measurement embodying the present invention.
Figure 8B:
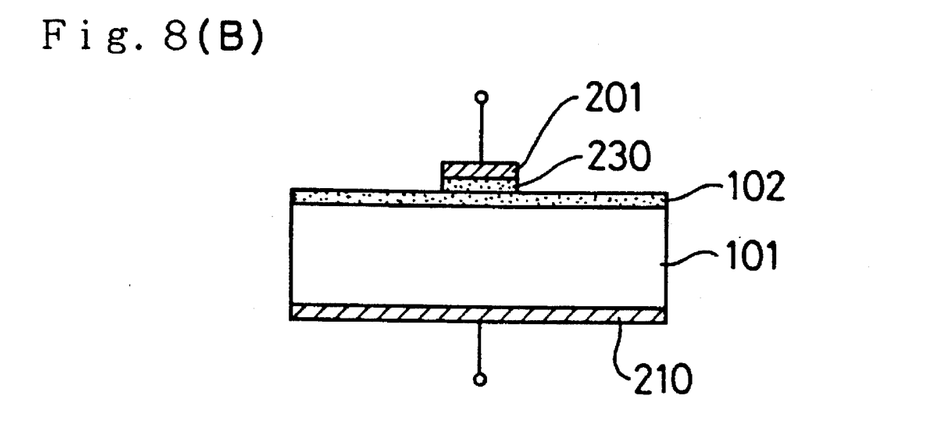

The above embodiment can be modified, for example, as follows:

(1) FIGS. 8(A) and 8(B) schematically illustrate another way to construct a capacitor between the test electrode 201 and the semiconductor wafer. As shown in FIG. 8(A), the test electrode 201 is provided with an insulating film 230 on its lower surface, and the test electrode 201 is brought down so that the insulating film 230 is pressed against the oxide film 102 of the semiconductor wafer as shown in FIG. 8(B). For this structure, the term $\epsilon_{ox}d_{air}$ in the equation (4) is replaced by a value representing a thickness $d_{in}$ of the insulating film 230 (FIG. 8(A)) converted in terms of oxide thickness. Especially, if the insulating films 230 is made of the same material with the oxide film 102, the term $\epsilon_{ox}d_{air}$ can be replaced simply by the thickness $d_{in}$. The method of FIGS. 8(A) and 8(B) does not require any time-consuming and labor-consuming preparation, but readily establishes the measurement condition only by pressing the electrode 201 with the insulating film 230 against the surface of the semiconductor wafer.

(2) The present invention is not limited to the measurement of the electric charge of an insulating film formed on the surface of a semiconductor substrate, but may be applicable to any measurement of electric charge of an insulating film formed on a conductive surface of a semiconductor. For example, the present invention is applicable to a semiconductor having an SOI (Silicon On Insulator) structure.

(3) In the above embodiment, the oxide film 102 formed on the surface of the semiconductor wafer is spaced by a predetermined gap from the test electrode 201 in C-V curve measurement. In the cases where electric charges exist within the oxide film 102 as Examples 1 and 2, however, the test electrode 201 may be brought in contact with the surface of the oxide film 102. The direct contact of the test electrode 201 can be also carried out by the non-destructive C-V measurement device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of measuring an electric charge in an insulating film formed on a surface of a substrate of a semiconductor wafer, said method comprising steps of:

(a) measuring a C-V characteristic of said semiconductor wafer to determine a first flat-band voltage;

(b) treating said semiconductor wafer by a specific process;

(c) measuring a C-V characteristic of said semiconductor wafer after performing said specific process, to determine a second flat-band voltage; and (d) determining said electric charge in said insulating film of said semiconductor wafer accumulated through said specific process as a function of said first and second flat-band voltages.

2. A method of measuring an electric charge in an insulating film formed on a surface of a substrate of a semiconductor wafer, said method comprising steps of:

(a) providing a non-destructive measuring device comprising a test electrode and holding means for holding said test electrode apart from said semiconductor wafer;

(b) measuring a C-V characteristic of said semiconductor wafer with said non-destructive measuring device to determine a first flat-band voltage Vfb;

(c) treating said semiconductor wafer by a specific process;

(d) measuring a C-V characteristic of said semiconductor wafer after performing said specific process with said non-destructive measuring device, to determine a second flat-band voltage V'fb; and (e) determining said electric charge in said insulating film of said semiconductor wafer accumulated through said specific process as a function of said first and second flat-band voltages.

3. A method in accordance with claim 2, wherein said step (b) comprises a step of holding said test electrode spaced from said semiconductor wafer by a gap $d_{air}$;

said step (d) comprises a step of holding said test electrode spaced from said semiconductor wafer by said gap $d_{air}$; and the step (e) comprises a step of determining the electric charge qNi according to equation:

$$\Delta Vfb = \frac{Rp + \epsilon in d air}{\epsilon 0 \epsilon in} qNi$$

where $\Delta V_{fb}$ is equal to $(V'_{fb} - V_{fb})$, Rp denotes a projected range of charged particles injected into said insulating film through said specific process, $\epsilon 0$ denotes a permittivity in vacuum, and $\epsilon_{in}$ denotes a dielectric constant of said insulating film.

4. A method in accordance with claim 3, wherein each of said steps (b) and (d) further comprises steps of:
    introducing a light beam into a transparent reflector of said holding means to be reflected by a reflecting plane of said reflector under geometric optical total reflection conditions while said reflecting plane is spaced substantially parallel to said semiconductor wafer;
    measuring a reflectance of said light beam reflected by said reflecting plane; and
    determining said gap $d_{air}$ as a function of said reflectance.

5. A method in accordance with claim 2, wherein said step (b) comprises a step of holding said test electrode spaced from said semiconductor wafer by a first gap $d_{air}$;

said step (d) comprises a step of holding said test electrode spaced from said semiconductor wafer by a second gap $d'_{air}$; and said step (e) comprises the step of determining an electric charge qNi according to equations:

$$qNi = \frac{din + \epsilon in\, dair}{Rp + \epsilon in\, dair}(qN'fb - qNfb)$$

$$qNfb = \frac{\epsilon 0 \epsilon in}{(din + \epsilon in\, dair)}(\phi ms - Vfb)$$

$$qN'fb = \frac{\epsilon 0 \epsilon in}{(din + \epsilon in\, d'air)}(\phi ms - V'fb)$$

where Rp denotes a projected range of charged particles injected into said insulating film through said specific process, $\epsilon 0$ denotes a permittivity in vacuum, $\epsilon_{in}$ denotes a dielectric constant of said insulating film, $d_{in}$ denotes a thickness of said insulating film, and $\phi_{ms}$ denotes a work function difference between said test electrode and said substrate.

6. A method in accordance with claim 5, wherein said step (b) further comprises steps of:

introducing a first light beam into a transparent reflector of said holding means to be reflected by a reflecting plane of said reflector under geometric optical total reflection conditions while said reflecting plane is spaced substantially parallel to said semiconductor wafer;

measuring a first reflectance of said first light beam reflected by said reflecting plane; and determining said first gap $d_{air}$ as a function of said first reflectance; and said step (d) further comprises steps of:

introducing a second light beam into said transparent reflector to be reflected by said reflecting plane in geometric optical total reflection conditions while said reflecting plane is spaced substantially parallel to said semiconductor wafer;

measuring a second reflectance of said second light beam reflected by said reflecting plane; and determining said second gap $d'_{air}$ as a function of said second reflectance.

7. A method of measuring an electric charge in a first insulating layer formed on a surface of a substrate of a semiconductor wafer, said method comprising the steps of:

(a) providing a measuring device comprising a test electrode having a second insulating layer under said test electrode;

(b) placing said test electrode onto said semiconductor wafer so that said second insulating layer is in contact with said first insulating layer, and measuring a C-V characteristic of said semiconductor wafer with said measuring device to determine a first flat-band voltage Vfb;

(c) treating said semiconductor wafer by a specific process;

(d) placing said test electrode onto said semiconductor wafer so that said second insulating layer is in contact with said first insulating layer, and measuring a C-V characteristic of said semiconductor wafer after performing said specific process with said measuring device, to determine a second flat-band voltage V'fb; and (e) determining said electric charge in said first insulating layer of said semiconductor wafer accumulated through said specific process as a function of said first and second flat-band voltages.

8. A method in accordance with claim 7, wherein the step (e) comprises a step of determining the net electric charge qNi according to equation:

$$\Delta Vfb = -\frac{Rp + \frac{\epsilon in1\, din2}{\epsilon in2}}{\epsilon 0 \epsilon in1}\, qNi$$

where $\Delta V_{fb}$ is equal to $(V'_{fb} - V_{fb})$, Rp denotes a projected range of charged particles injected into said first insulating layer through said specific process, $\epsilon 0$ denotes a permittivity in vacuum, $\epsilon_{in1}$ denotes a dielectric constant of said first insulating layer, $\epsilon_{in2}$ denotes a dielectric constant of said second insulating layer, and $d_{in2}$ denotes a thickness of said second insulating layer.

9. A method of measuring electric charge in an first insulating layer formed on a surface of a substrate of a semiconductor wafer, said method comprising the steps of:

(a) providing a measuring device comprising a test electrode having a second insulating layer under said test electrode;

(b) placing said test electrode onto said semiconductor wafer so that said second insulating layer is in contact with said first insulating layer, and measuring a C-V characteristic of said semiconductor wafer with said measuring device to determine a first flat-band voltage Vfb;

(c) treating said semiconductor wafer by a specific process;

(d) positioning said test electrode relative to said semiconductor wafer so that said second insulating layer is in contact with said first insulating layer, and measuring a C-V characteristic of said semiconductor wafer after performing said specific process with said measuring device, to determine a second flat-band voltage V'fb; and (e) determining said electric charge in said first insulating layer of said semiconductor wafer accumulated through said specific process as a function of said first and second flat-band voltages.

10. A method in accordance with claim 9, wherein the step (e) comprises a step of determining the net electric charge qNi according to equation:

$$\Delta Vfb = -\frac{Rp + \frac{\epsilon in1\, din2}{\epsilon in2}}{\epsilon 0 \epsilon in1}\, qNi$$

where $\Delta V_{fb}$ is equal to $(V'fb - V_{fb})$, Rp denotes a projected range of charged particles injected into said first insulating layer through said specific process, $\epsilon 0$ denotes a permittivity in vacuum, $\epsilon in1$ denotes a dielectric constant of said second insulating layer, and din2 denotes a thickness of said second insulating layer.

* * * * *